United States Patent [19]

Gahan

[11] Patent Number: 5,148,112
[45] Date of Patent: Sep. 15, 1992

[54] EFFICIENT ARBITER

[75] Inventor: Richard A. Gahan, Clonmel, Ireland

[73] Assignee: Digital Equipment Corporation, Maynard, Mass.

[21] Appl. No.: 723,055

[22] Filed: Jun. 28, 1991

[51] Int. Cl.$^5$ .............................................. H03K 5/20
[52] U.S. Cl. .................................. 328/110; 307/518; 328/109
[58] Field of Search ................... 307/272.2, 480, 445, 307/518, 269; 328/110, 109, 104, 137, 154; 364/200, 900

[56] References Cited

U.S. PATENT DOCUMENTS

| | | | |
|---|---|---|---|
| 4,594,657 | 6/1986 | Byrns | 364/200 |
| 4,620,118 | 10/1986 | Barber | 328/109 |
| 4,641,266 | 2/1987 | Walsh | 364/200 |
| 4,853,653 | 8/1989 | Maher | 328/137 |
| 4,894,565 | 1/1990 | Marquardt | 307/518 |
| 4,998,027 | 3/1991 | Mihara et al. | 307/480 |

Primary Examiner—Edward P. Westin
Assistant Examiner—Andrew Sanders
Attorney, Agent, or Firm—Kenyon & Kenyon

[57] ABSTRACT

A logic circuit for use as an arbiter to arbitrate among N devices of a computer system for access to a shared resource. The arbiter generates state variables to represent arbitration win information. The state variables are generated through the use of request for arbitration signals input to the arbiter, present values of the state variables and internally generated intermediate arbitration win signals to provide a cost effective, efficient implementation of the logic required for the arbitration in a smaller physical solution for the arbitration logic.

8 Claims, 5 Drawing Sheets

FIG. 4

PRESENT STATE/NEXT STATE TABLE

| PRESENT STATE<br>W3(H), W2(H), W1(H) | SYNCHRONIZED INPUTS<br>RS3(L), RS2(L), RS1(L) | NEXT STATE<br>W3(H), W2(H), W1(H) |
|---|---|---|
| 000 | 111 | 000 |
| 000 | XX0 | 001 |
| 000 | X01 | 010 |
| 000 | 011 | 100 |
| 001 | XX0 | 001 |
| 001 | X01 | 010 |
| 001 | 011 | 100 |
| 001 | 111 | 000 |
| 010 | X0X | 010 |
| 010 | 01X | 100 |
| 010 | 11X | 000 |
| 100 | 0XX | 100 |
| 100 | 1XX | 000 |
| 011 | X0X | 010 |
| 011 | 01X | 100 |
| 011 | 11X | 000 |
| 110 | 0XX | 100 |
| 110 | 1XX | 000 |
| 101 | 0XX | 100 |
| 101 | 1XX | 000 |
| 111 | 0XX | 100 |
| 111 | 1XX | 000 |

Columns labeled 50, 51, 52.

EFFICIENT ARBITER

FIELD OF THE INVENTION

The present invention is directed to resource allocation and arbitration in a computer system and, more particularly, to an implementation efficient logic circuit used as an arbiter to control access to a shared resource by N devices.

BACKGROUND OF THE INVENTION

Modern computer systems often comprise a plurality of operating devices such as processors and I/O controllers and a shared resource such as a shared memory. The shared memory is made available to each of the plurality of devices in the computer system as a memory service for the storage of data. Typically, the processors, I/O controllers and the shared resource are coupled to one another by a bus and only one device at a time can access the shared resource over the bus. Accordingly, it is necessary to provide an arbitration scheme in the computer system to decide which one of several devices that may be requesting access to the shared memory will be granted control of the bus for the performance of read and write operations with the shared memory.

A known method for implementing an arbitration scheme in a computer system consists of reducing a flow chart description of the logic required for the arbitration scheme into a gate level logic circuit implementation through the use of karnaugh maps. Typically, the gate level implementation comprises a state machine wherein input signals corresponding to requests by the devices for access to the shared resource result in the generation of state variables that indicate which device has won the arbitration. A problem with the presently utilized gate level implementations for arbitration schemes is that the design uses only state variables and input signals to generate the next state variables. In addition, unused or invalid states for the state variables of the state machine are typically placed in the logic design so as to transition to a null state or to zero. Thus, presently known arbitration scheme implementations often require the use of a large number of components and gates to generate the necessary state variables, resulting in excessive cost and complexity.

SUMMARY OF THE INVENTION

The present invention provides an implementation efficient logic circuit that functions as an arbiter to arbitrate between N devices of a computer system for access to a shared resource. The arbiter according to the present invention implements a logic design wherein next state variables utilized to indicate which device has won the arbitration are generated through the use of input signals, state variables and internally generated intermediate arbitration win signals coupled to one another in the logic design.

Moreover, the positioning of each unused or invalid state in the logic design is selected so that each invalid state transitions to a valid state. The use of intermediate arbitration win signals and present state variables in, e.g., a NOR gate array, and the positioning of invalid states that result in a transition to a valid state provides a minimal solution for the logic design with a significant reduction in the total number of components that would be required to implement an arbitration logic using conventional design techniques. The resulting arbiter will have the advantage of being more cost effective than conventional arbiter designs and provides a smaller physical solution for a required arbitration scheme.

BRIEF DESCRIPTION OF THE DRAWINGS

FIG. 4 illustrates a present state/next state table for the arbiter of FIG. 2.

DETAILED DESCRIPTION

Figure 1:
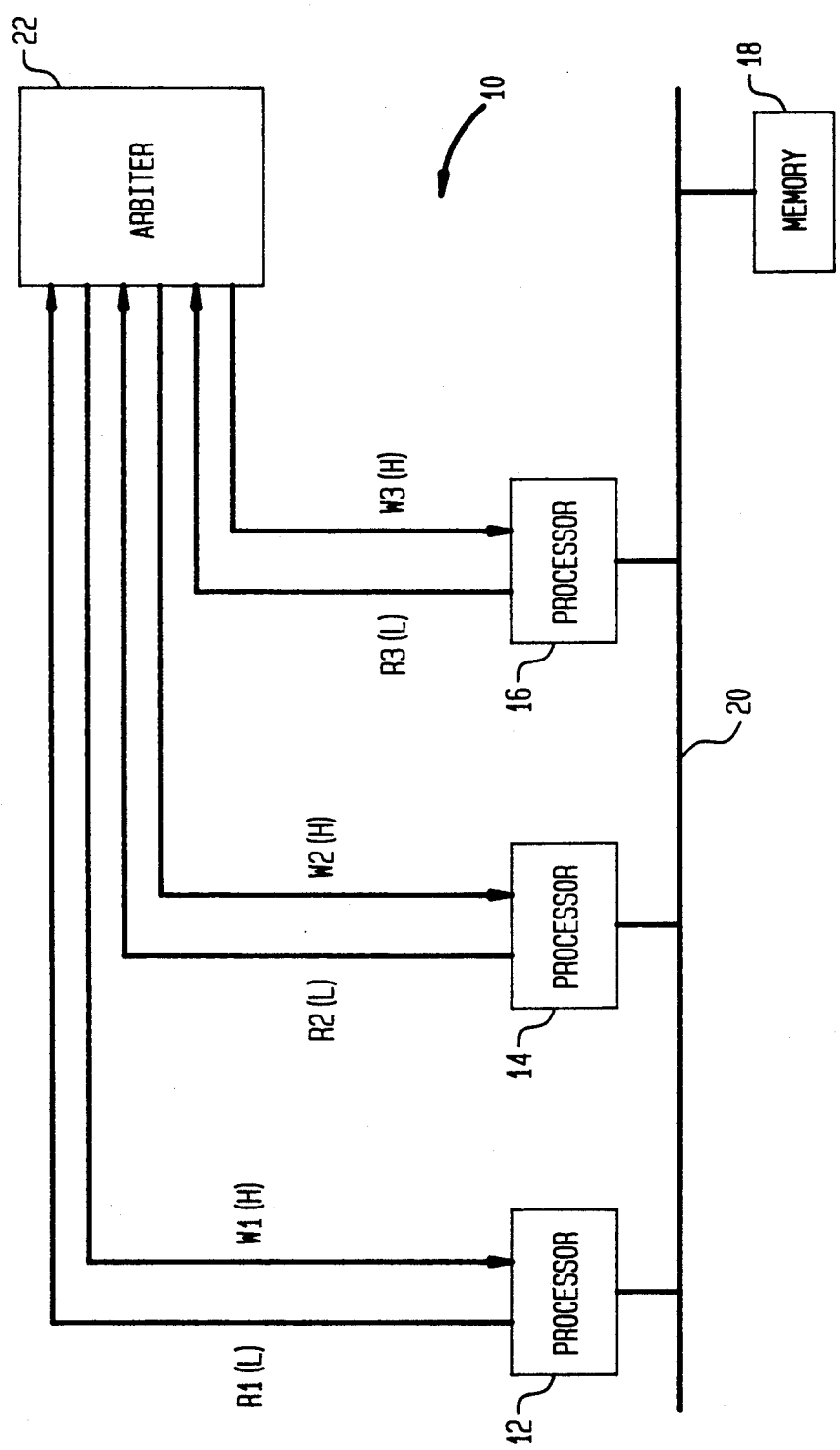
FIG. 1 illustrates a computer system comprising a plurality of devices coupled to each of a common resource and an arbiter according to the present invention.

Referring now to the drawings, and initially to FIG. 1, there is illustrated a computer system 10 comprising three devices 12, 14, 16 and a shared resource 18. Each of the devices 12, 14, 16 can be a processor and the shared resource 18 can comprise a shared memory. The processors 12, 14, 16 and the shared memory 18 are coupled to one another by a bus 20.

As should be understood, only one of the processors 12, 14, 16 can control the bus 20 at any one time for access to the shared memory 18. Accordingly, each of the processors 12, 14, 16 is coupled to an arbiter 22 by a request line R1(L), R2(L) and R3(L), respectively. When any one of the processors 12, 14, 16 requires access to the shared memory 18, it will assert a request signal, low active, on its respective request line R1(L), R2(L), R3(L).

The arbiter 22 comprises a state machine arranged to generate state variables W1(H), W2(H), W3(H) as a function of the assertion of requests R1(L), R2(L), R3(L) by the processors 12, 14, 16. The state variables W1(H), W2(H), W3(H) are coupled to the processors 12, 14, 16, respectively, with either none of the state variables W1(H), W2(H), W3(H) being asserted or a single state variable W1(H), W2(H), or W3(H) being asserted, high active, at any one time to indicate which one of the processors 12, 14, 16 has been granted access to the shared memory 18. In this manner, the state variables W1(H), W2(H), W3(H) output by the arbiter 22, are supplied as respective inputs to the devices 12, 14, 16 with each state variable W1(H), W2(H), W3(H) indicating to a particular device 12, 14, 16 whether it has been granted access to the shared memory 18.

Figure 2:
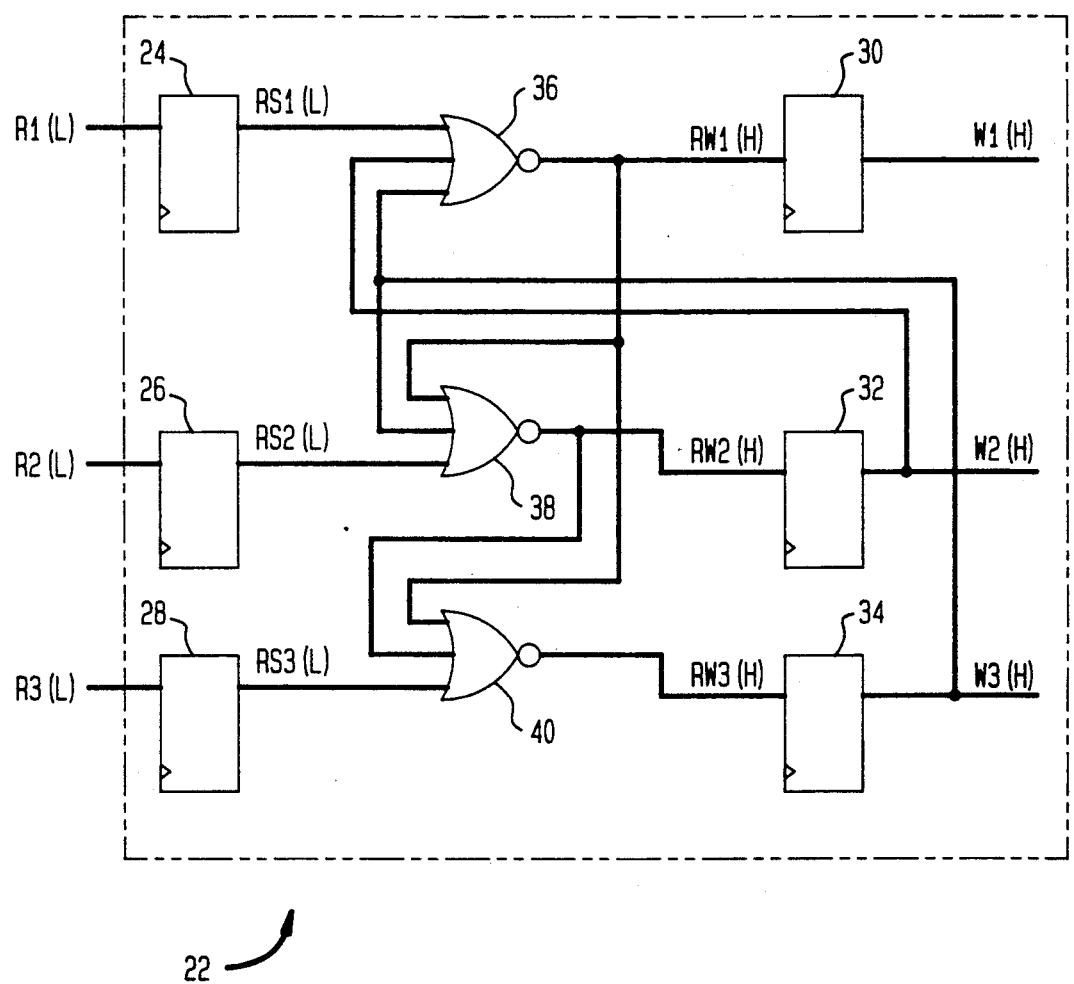
FIG. 2 illustrates a schematic diagram of the arbiter of FIG. 1.

The arbiter 22 of FIG. 1 is illustrated in greater detail in FIG. 2. Generally, the requests, R1(L), R2(L) and R3(L) are input to the arbiter 22 as asynchronous signals. Each request indicates whether the respective device 12, 14, 16 wants access to the shared memory 18. The requests are each asserted low active when the respective processor 12, 14, 16 wants access to the shared memory 18 and each request R1(L), R2(L), R3(L) is input to a respective one of a first stage of three flip-flops 24, 26, 28. The flip-flops 24, 26, 28 are used to synchronize the asynchronous requests R1(L), R2(L), R3(L) and output corresponding synchronized access request signals RS1(L), RS2(L), RS3(L).

A second stage of three D-type flip-flops 30, 32, 34 represents the three state variables W1(H), W2(H), W3(H). The combinational logic of the arbiter 22 illustrated in FIG. 2 includes a series of three NOR-gates 36, 38, 40 arranged to couple the first stage of flip-flops 24, 26, 28 to the second stage of D-type flip-flops 30, 32, 34. The NOR-gates 36, 38, 40 operate to arbitrate the three synchronized requests RS1(L), RS2(L), RS3(L) and thereby generate three intermediate arbitration win output signals RW1(H), RW2(H), RW3(H) that are used as inputs to the D-type flip-flops 30, 32, 34, respectively. Accordingly, on the next clock edge, only one of the state variables W1(H), W2(H) or W3(H) is asserted, as will appear.

The arbiter 22 of the present invention couples each of the state variables W2(H) and W3(H), output from the second and third ones of the second-stage flip-flops 32, 34, as input signals to each preceding one of the first and second NOR gates 36, 38, respectively, and couples each of the outputs of the first and second ones of the Nor gates 36, 38, RW1(H) and RW2(H), as input signals to the second and third NOR gates 36, 38, respectively. Thus, the arbiter 22 uses both the state variables W2(H), W3(H) and the previously generated intermediate arbitration win signals RW1(H) and RW2(H), in the generation of the inputs to the D-type flip-flops 30, 32, 34.

Referring once again to FIG. 2, the arbiter 22 will now be described in detail. The first asynchronous request R1(L), from the processor 12, is applied to the input of the first flip-flop 2 of the first stage of flip-flops. The output of the first flip-flop 24, RS1(L), is coupled to one of the inputs of the first NOR gate 36. The remaining inputs to the first NOR gate 36 are coupled to the outputs of the second and third ones of the second-stage flip-flops 32, 34, respectively. Thus, the synchronized access request signal RS1(L), output from the first flip-flop 24, is input into the first NOR gate 36 with the state variables W2(H) and W3(H) being used as second and third inputs to the first NOR gate 36.

The output of the first NOR gate 36, RW1(H), is coupled to the input of the first one of the second-stage flip-flops 30 and to the inputs of each of the second and third NOR gates 38, 40. The state variable W1(H), output from the first one of the second-stage flip-flops 30, is coupled to the first processor 12 (See FIG. 1).

The second asynchronous request R2(L), from the processor 14, is applied to the input of the second flip-flop 26 of the first stage of flip-flops. The second synchronous access request RS2(L) is output from the second flip-flop 26 and is applied as an input to one of the inputs of the second NOR gate 38. Another input to the second NOR gate 38 is coupled to the output RW1(H) of the first NOR gate 32 while the remaining input to the second NOR gate 38 is coupled to the output W3(H), of the third one of the second stage flip-flops 34. Thus, the second or gate 38, receives the signals RS2(L), RW1(H) and W3(H) as its three inputs, respectively.

The output of the second NOR gate 38 is coupled to the input of the second one of the second stage flip-flops 32 and to an input of the third NOR gate 40. Thus, both the second second-stage flip-flop 32 and the third NOR gate 40 receive the output, RW2(H), of the second NOR gate 38, as an input. The output of the second second-stage flip-flop 32 is coupled to the input of the first NOR gate 36 and to the second processor 14. Thus, the first NOR gate 36 has the output of the second second-stage flip-flop 10, the state variable W2(H), as one of its inputs.

The asynchronous request R3(L), from the processor 16, is input into the third flip-flop 28. The third synchronous access request RS3(L) output by the third flip-flop 38 serves as an input to the third NOR gate 40. The third NOR gate 40 includes two other inputs coupled to the outputs of the first and second NOR gates 36, 38, respectively. Thus, the output of the first Nor gate 36, RW1(H), and the output of the second NOR gate 38, RW2(H), each serve as inputs to the third Nor gate 40.

The output of the third NOR gate 40 is the signal RW3(H) which serves as an input to the third of the second-stage flip-flops 34. The output of the third second-stage flip-flop 34 is coupled to the third processor 16 and to an input of each of the first and second Nor gates 36, 38. Thus, the output of the third second-stage flip-flop 34, the state variable W3(H), is provided as an input to each of the first and second NOR gates 36, 38.

Figure 3:
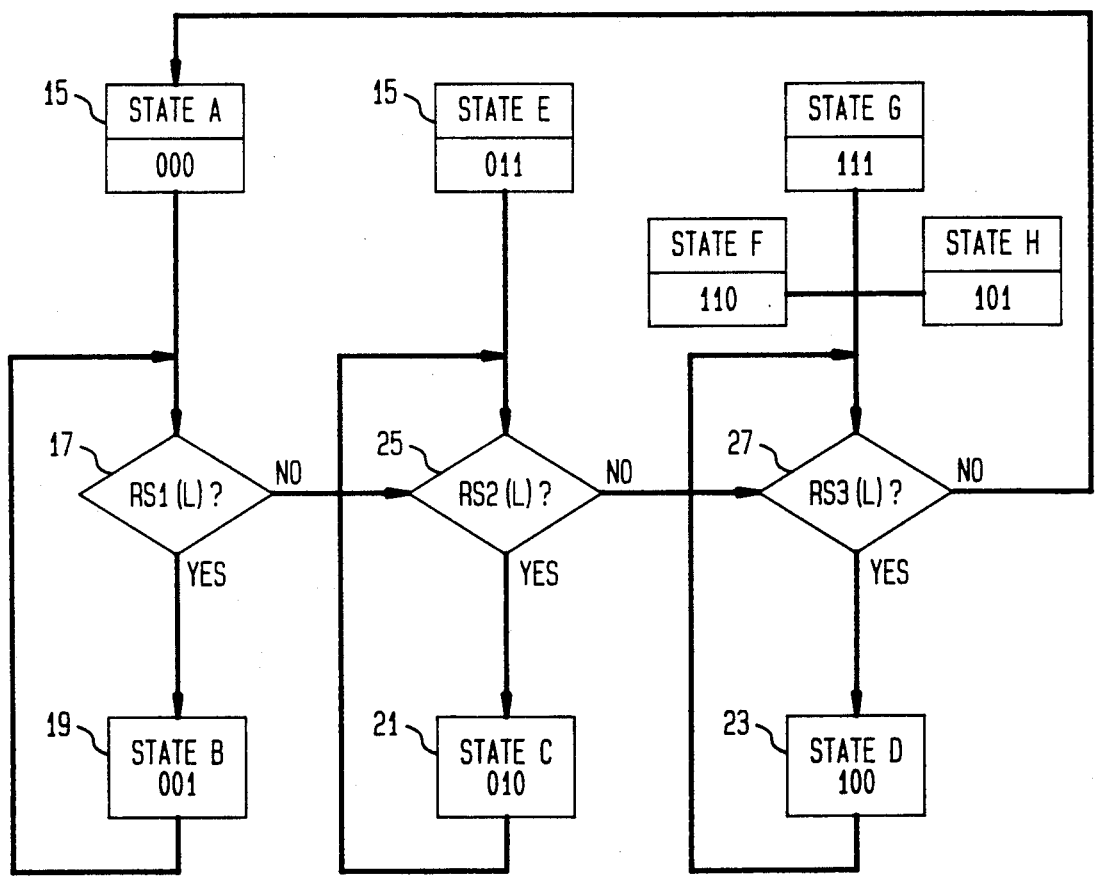
FIG. 3 illustrates a state diagram for the arbiter of FIG. 2.

The operation of the arbiter 22 of FIG. 2 is illustrated in the state diagram of FIG. 3. FIG. 3 shows a state diagram flow chart for implementing the three input arbiter 22 of FIG. 2, with all unused states accounted for.

A block 15 represents state A in which the state variables W3(H), W2(H), W1(H) have the present values 0,0,0 respectively.

When the first processor 12 asserts a request R1(L) for access to the shared memory 18 as represented by block 17 (Yes), the synchronized access request signal RS1(L) is low, and the arbiter 22 transitions to a state B, represented by block 19, in which the state variables W3(H), W2(H), W1(H) have the values 0,0,1 respectively.

The arbiter 22 remains in state B 19 as long as the first processor 12 continues to assert a request RS1(L) for access to the shared memory 18. When the synchronized access request RS1(L) stops being asserted, the arbiter 22 transitions into a state C, represented by block 21, a state D, represented by block 23 or back to state A 15. The state the arbiter 22 transitions to depends on whether the second or third processors 14, 16 have or have not asserted a request signal R2(L) or R3(L).

In state C 21, the state variables W3(H), W2(H), W1(H) have the values 0,1,0 while in state D 18 they have the values 1,0,0, respectively. When no synchronized access requests RS1(L), RS2(L), RS3(L) are being asserted as reflected in blocks 17, 25, and 27, the arbiter 22 transitions into state A 15 and remains there until a request RS1(L), RS2(L) or RS3(L) is asserted.

If the first processor 12 does not assert a request R1(L) and the second processor 14 does assert a request R2(L), for access to the shared memory 18, the synchronized signal RS2(L) is low, and the arbiter 22 transitions into state C 17 (block 17 represents no and block 25 represents yes). Once in state C 17, the arbiter 22 remains in that state so long as the second processor 14 continues to assert the access request signal R2(L) for access to the shared memory 18. When the second processor 14 no longer asserts the access request R2(L), the arbiter 22 transitions into state D 23 if the third processor 16 has asserted an access request RS3(L) (block 27 yes). Otherwise, the arbiter 22 transitions back to state A 15 (block 27 no).

When neither the first nor second processor 12, 14 is asserting a request and the third processor 16 is asserting a request, R3(L), for access to the shared memory 18, the synchronized signal RS3(L) is low and the arbiter 22 transitions into state D 23 (block 17 no, block 25 no, block 27 yes). Once in state D 23, the arbiter 22 will remain there so long as the synchronized access request signal RS3(L) remains asserted. When the third processor 16 stops asserting the access request, RS3(L) becomes high and the arbiter 22 transitions to state A 15.

When none of the processors 12, 14, 16 are asserting a request for access to the shared memory 18, the arbiter 22 remains in state A 15 until a request RS1(L), RS2(L) or RS3(L) is asserted (blocks 17, 25, 27).

Four states are invalid and the arbiter 22 is never allowed to enter them. As should be understood, the state variables indicate one of the requesting devices that has been granted access to the shared resource. The four invalid states include each possible state wherein more than one of the state variables are asserted and are defined by the state variables W3(H), W2(H), W1(H) having the values (state E: 0,1,1); (state F: 1,1,0); (state G: 1,1,1); or (state H: 1,0,1). As illustrated in FIG. 3, state E will transition to block 25 and states F, G, and H will transition to block 27.

The positioning of the invalid states illustrated in FIG. 3 causes each invalid state to transition to one of the valid states, depending on the status of the input request signals as determined in blocks 25 and 27, respectively. The placement of these invalid states together with the use of both previously generated state variables and intermediate arbitration win signals at the NOR gates results in a cost effective and efficient minimum solution for the logic design.

FIG. 4 illustrates a present state/next state table derived from the state diagram of FIG. 3, for the arbiter 22 of FIG. 2. The state table contains a first column 50 listing the present state values of the state variables W3(H), W2(H), and W1(H) respectively. A second column 51 lists the values of the three synchronized input signals RS3(L), RS2(L), and RS1(L). A third column 52 of the state table lists the next state values for the state variables W3(H), W2(H), and W1(H) given the present state values of the first column 50 and the input values of the second column 51.

The presence of an x in the second column 51 represents a "don't care" condition. This means that the value of the input RS3(L), RS2(L) or RS1(L), represented by an x in column 51, can assume either the value of a 1 or a 0 (high or low) without affecting the operation of the arbiter 22 or the next state that the arbiter 22 will enter.

As discussed above, the arbiter 22 of FIG. 2 utilizes the set of three input NOR gates 36, 38, 40 to generate intermediate arbitration win signals RW1(H), RW2(H) and RW3(H). The signals RW1(H), RW2(H), RW3(H) provide both a series of input signals for the corresponding flip-flops 30, 32, 34 of the second set of flip-flops to generate the state variables W1(H), W2(H), W3(H) and a series of inputs to relatively subsequent NOR gates 38, 40 of the set of NOR gates. In addition, the state variables W1(H), W2(H) and W3(H), provide indications of an arbitration win to the respective processors 12, 14, 16 and a series of inputs to relatively preceding NOR gate 36, 38 of the set of NOR gates. The design of the arbiter 22 permits the arbitration scheme to be implemented with three input NOR gates and only two stages of logic subsequent to the request signal synchronization stage.

The following discussion describes an analysis of the logic embodied in the arbiter 22 and the novel design considerations and principles of the present invention that provide the three input NOR gate array of the arbiter 22. To implement the three input arbiter 22 illustrated in FIG. 2, D-type flip-flops 30, 32, 34 are utilized for the second stage of flip-flops. The use of D-type flip-flops makes it necessary to define when the input of each flip-flop is in a high state, i.e., a "1". The input to state variable W1(H) is RW1(H), the input to state variable W2(H) is RW2(H) and the input to state variable W3(H) is RW3(H). A "−" in front of a signal name indicates a "NOT" function.

The signals RW1(H), RW2(H) and RW3(H) of the state table of FIG. 4 can be represented by the following standard minimum sum logic equations expressed in terms of inputs (RS1(L), RS2(L), RS3(L)) and state variables (W1(H), W2(H), W3(H)), as is conventional; (RWN(H) is high when the statement after the = sign is true; a . represents a logical AND function and a + represents a logical OR function):

$$RW1(H) = -W3(H) \cdot -W2(H) \cdot -W1(H) \cdot -RS1(L) + \\ -W3(H) \cdot -W2(H) \cdot W1(H) \cdot -RS1(L) \\ = -(W3(H) + W2(H) + RS1(L)) + \\ -W3(H) \cdot -W2(H) \cdot W1(H) \cdot -RS1(L)$$

I.

Thus, RW1(H) = −(W3(H)+W2(H)+RS1(L)) and may be implemented through the use of a three input NOR gate.

$$RW2(H) = -W3(H) \cdot -W2(H) \cdot -W1(H) \cdot \\ -RS2(L) \cdot RS1(L) \\ = -W3(H) \cdot -W2(H) \cdot -RS2(L) \cdot -RS1(L) + \\ -W3(H) \cdot W2(H) \cdot -RS2(L) \\ = -W3(H) \cdot -RS2(L) \cdot (RS1(L) + W2(H)) + \\ -W3(H) \cdot -W2(H) \cdot W1(H) \cdot -RS2(L) \cdot RS1(L) \\ = -W3(H) \cdot -W2(H) \cdot -RS2(L) \cdot -RS1(L) + \\ -W3(H) \cdot W2(H) \cdot -RS2(L) \\ = -W3(H) \cdot -RS2(L) \cdot (-W2(H) \cdot RS1(L) + W2(H)) \\ = -W3(H) \cdot -RS2(L) \cdot (RS1(L) + W2(H)).$$

II.

Thus, the standard minimum sum solution for the RW2(H) is:

$$RW2(H) = -W3(H) \cdot -RS2(L) \cdot (RS1(L) + W2(H))$$

This solution requires logic for four terms (W3(H), RS2(L), RS1(L) and W2(H)), when expressed solely in terms of inputs and state variables and is not suitable for a three input NOR gate.

$$RW3(H) = -W3(H) \cdot -W2(H) \cdot -W1(H) \cdot \\ -RS3(L) \cdot RS1(L) \cdot RS2(L) + \\ -W3(H) \cdot -W2(H) \cdot W1(H) \cdot \\ -RS3(L) \cdot RS1(L) \cdot RS2(L) + -W3(H) \cdot \\ W2(H) \cdot -W1(H) \cdot -RS3(L) \cdot RS2(L) + \\ W3(H) \cdot -W2(H) \cdot -W1(H) \cdot -RS3(L) + \\ -W3(H) \cdot W2(H) \cdot W1(H) \cdot -RS2(L) \cdot RS3(L) + \\ W3(H) \cdot W2(H) \cdot W1(H) \cdot -RS3(L) + \\ W3(H) \cdot W2(H) \cdot -W1(H) \cdot -RS3(L) + \\ W3(H) \cdot -W2(H) \cdot W1(H) \cdot -RS3(L)$$

III.

$$= -W3(H) \cdot -W2(H) \cdot -RS3(L) \cdot RS1(L) \cdot RS2(L)$$
+
$$-W3(H) \cdot W2(H) \cdot -W1(H) \cdot -RS3(L) \cdot RS2(L)$$
+
$$W3(H) \cdot -RS3(L)$$

Thus, the standard minimum sum solution for RW3(H) is:

$$RW3(H) = -RS3(L) \cdot RS1(L) \cdot RS2(L) + W2(H) \cdot \\ -RS3(L) \cdot RS2(L) + W3(H) \cdot -RS3(L)$$

This solution requires logic for five terms, (RS3(L), RS2(L), RS1(L), W3(H) and W2(H)) and is also not suitable for a three input NOR gate.

The above solutions to RW1(H), RW2(H) and RW3(H) are the standard minimum sum of the products form expressed in terms of inputs and state variables and used in conventional logic circuits. As can be seen, neither of the conventional minimum sum solutions for RW2(H) and RW3(H) can be implemented in a three input NOR gate.

The new efficient implementation design illustrated in FIG. 2 is based upon the known minimum sum of the products form set forth above.

The following logic derivation, according to the design principles of the present invention, applies De Morgan's Logic theorems and uses the fact that A.-−A=0 to simplify the conventional minimum solution to the point where a three input NOR gate array can be utilized throughout the arbiter 22. A full explanation of the De Morgan's Logic theorems may be found in *Engineering Approach to Digital Design* by William J. Fletcher.

For RW1(H):

$$RW1(H) = -(W3(H) + W2(H) + RS1(L))$$

The known minimum solution for RW1(H) can be implemented in a three input NOR gate and thus requires no change.

For RW2(H):

$$RW2(H) = -W3(H).-RS2(L).(RS1(L) + W2(H))$$

This is the known minimum solution from above which serves as the current starting point.

Adding redundancy to the above equation:

$$RW2(H) = -W3(H).-RS2(L).(W3(H) + RS1(L) + W2(H))$$

substituting RW1(H) for (W3(H)+RS1(L)+W2(H))

$$RW2(H) = -W3(H).-RS2(L).-RW1(H)$$

applying De Morgan's Logic theorems:

$$RW2(H) = -(W3(H) + RS2(L) + RW1(H))$$

This solution for RW2(H) may be implemented through the use of a three input NOR gate.

For RW3(H):
From the previously derived equation, $$RW3(H) = -RS3(L).RS1(L).RS2(L) + W2(H).-RS3(L).RS2(L) + W3(H).-RS3(L)$$

Adding redundancy to this equation we get:

$$RW3(H) = -RS3(L) \cdot RS1(L) \cdot RS2(L) + W2(H) \cdot \\ -RS3(L) \cdot RS2(L) + W3(H) \cdot -RS3(L) + \\ W2(H) \cdot W3(H) \cdot -RS3(L) + \\ W3(H) \cdot RS1(L) \cdot -RS3(L)$$

By recognizing that RW1(H)=−W3(H).−W2(H).−RS1(L), RW2(H)=−W3(H).−RS2(L).−RW1(H) and that A(H).−A(H)=0, we can add still more redundancy to the equation for RW3(H):

$$RW3(H) = -RS3(L) \cdot RS1(L) \cdot RS2(L) + W2(H) \cdot \\ -RS3(L) \cdot RS2(L) + \\ W3(H) \cdot -RS3(L) + W2(H) \cdot W3(H) \cdot \\ -RS3(L) + \\ W3(H) \cdot RS1(L) \cdot -RS3(L) + \\ -RS3(L) \cdot W2(H) \cdot RW1(H) + \\ -RS3(L) \cdot RS1(L) \cdot RW1(H)$$

Adding still more redundancy we obtain:

$$RW3(H) = -RS3(L) \cdot (W3(H) + W2(H) + RS1(L)) \cdot \\ (W3(H) + RS2(L) + RW1(H))$$
$$RW3(H) = -RS3(L) \cdot -RW1(H) \cdot -RW2(H)$$

Thus $RW3(H) = -(RS3(L) + RW1(H) + RW2(H))$ which may be implemented through the use of a three input NOR gate.

It is possible to extend the above design approach to an arbiter with N devices requesting access to a shared resource. Following the above design approach, the general solutions for an arbiter with N inputs is:

$$RW1(H) = -(RS1(L) + W2(H) + \ldots + \\ W(N - 1)(H) + WN(H)) \\ RW2(H) = -(RS2(L) + RW1(H) + W3(H) + \ldots + \\ W(N - 1)(H) + WN(H))$$

$$RW(N - 1)(H) = -((RS(N - 1)(L) + RW1(H) + \\ RW2(H) + \ldots + RW(N - 2)(H) + WN(H)) \\ RWN(H) = -(RSN(L) + RW1(H) + RW2(H) + \ldots + \\ RW(N - 1)(H))$$

Thus, following the design principles of the present invention, it is possible to implement an arbiter, with N inputs, through the use of D flip-flops and N input NOR gates.

Figure 5:
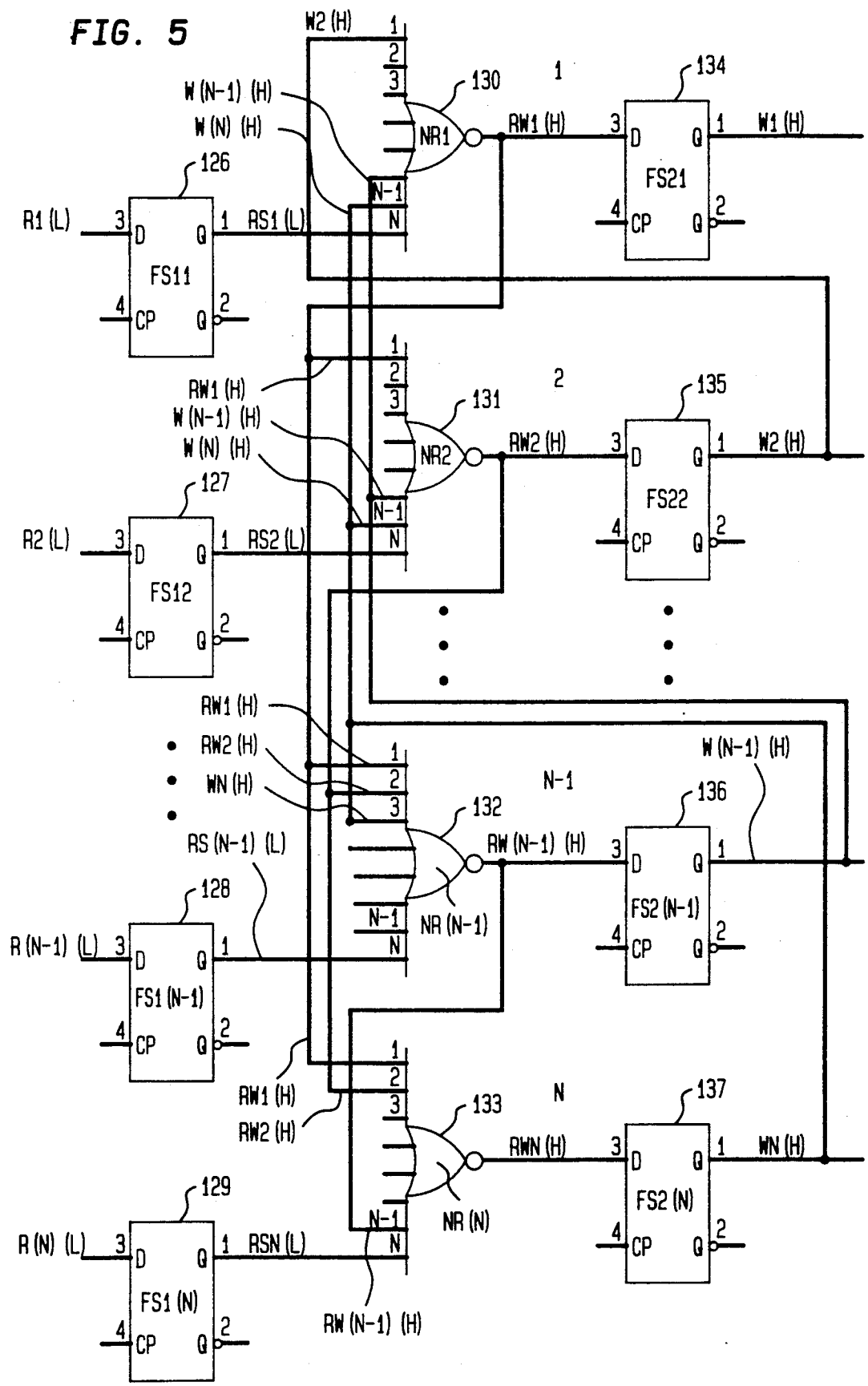
FIG. 5 illustrates a schematic diagram of an N input arbiter according to the present invention.

FIG. 5 illustrates an N input arbiter implemented in accordance with the design principles of the present invention. Asynchronous access requests R1(L), R2(L), ..., R(N)(L), are applied to the inputs of the N first stage flip-flops 126, 127, 128, 129, referred to as FS1(1), FS1(2), ..., FS1(N-1), FS1(N) respectively. The term FS1(n) is used to refer to the $n^{th}$ flip-flop in the $1^{st}$ stage of the arbiter. The term FS2(n) will be used to refer to the $n^{th}$ flip-flop in the second stage of flip-flop of the arbiter. The NOR gates 130, 131, 132, 133, shall be referred to in a similar manner as NR1 130 through NR(N) 133.

The synchronized requests RS1(L), RS2(L), ... RSN(L) for access to the shared resource are the outputs of the respective first stage flip-flops FS11, FS12, ..., FS1N 126–129.

The input to the first stage flip-flop FS11 126 is the asynchronous access request signal R1(L) output from a first device requesting access to a shared resource. The output of the first stage flip-flop FS11 126, RS1(L), is coupled to an input of an N input NOR gate 130 referred to as NR1. The remaining N-1 inputs of the NOR gate NR1 130 are coupled to the outputs of the second stage flip-flops 135, 136, 137 referred to as FS2(2) through FS2(N). In this manner, the state variables W2(H) through WN(H) are applied as inputs to NOR gate NR1 130.

The output of NOR gate NR1 130 is coupled to the input of the second stage flip-flop FS21 134 and to an input of each of the NOR gates NR2 131 through NRN 133. Therefore, the output signal RW1(H) of NOR gate NR1 130 is applied to the input of flip-flop FS2(1) 134 and is also applied as an input to NOR gates NR2 131 through NR(N) 133, respectively. The output of the flip-flop FS2(1) 134 is the state variable W1(H).

The input to the first stage flip-flop FS1(2) 127 is the asynchronous access request signal R2(L) from a second device. The output terminal of flip-flop FS1(2) 127, RS2((L), is coupled to an input of the Nor gate NR2 131. Another input of the NOR gate NR2 131 is coupled to the output of the NOR gate NR1 130. The remaining N-2 inputs to the NOR gate NR2 131 are coupled to the respective outputs of the second stage flip-flops FS2(3) through FS2(N) 137. The output of the NOR gate NR2 131, RW2(H), is coupled to the input of FS2(2) 135 and an input of each of the respective NOR gates NR3 through NR(N) 33. Thus, FS22 35 and the respective NOR gates NR3 through NR(N) 33 all have the output signal of NR2 31, RW2(H), as an input signal.

The output W2(H) of the second stage flip-flop FS2(2) 135 is coupled to an input of the NOR gate NR1 130.

Proceeding now to the (N-1) device, the asynchronous access request R(N-1)(L), serves as the input to the first stage (N-1) flip-flop FS1(N-1) 128. The output of FS1(N−1) 128, RS(N-1)(L) is coupled to an input of NOR gate NR(N-1) 132. The outputs of NOR gates NR1 30 through NR(N-2) are also coupled to respective inputs of NR(N-1) 132, applying the NOR gate output signals RW1(H) through RW(N-2)(H) as inputs to NR(N-1) 132. The remaining input of NR(N-1) 132 is coupled to the output of the flip-flop FS2(N) 137. The state variable WN(H) output by FS2(N) 137 is therefore an input to the NOR gate NR(N-1) 132.

The output of the NOR gate NR(N-1) 132 is coupled to the input of the flip-flop FS2(N-1) 136 and to an input of the NOR gate NR(N) 132. Thus, the output signal RW(N-1)(H) from NR(N-1) 132 serves as an input signal to both FS2(N-1) 136 and NR(N) 133. The output of flip-flop FS2(N-1) 136 is coupled to an input of each of the NOR gates NR1 30 through NR(N-2) respectively. Thus, the sate variable W(N-1)(H) output by FS2(N-1) 136 is an input to NR1 30 through NR(N-2).

The asynchronous access request signal RN(L) from the Nth device is input into the flip-flop FS1(N) 129. The output of FS1(N) 129, rsn(L), is coupled to an input of the NOR gate NR(N) 133. The remaining N-1 inputs to NR(N) are coupled to the outputs of NOR gates NR1 130 through NR(N-1) 132, respectively. Thus, the NOR gate output signals RW1(H) through RW(N-1)(H) are all inputs to the NOR gate NR(N) 133.

The output of NR(N) 133, RWN(H), is coupled to the input of flip-flop FS2(N) 137. The output of FS2(N) 37, in turn, is coupled to inputs of the NOR gates NR1 30 through NR(N-1) 32. Thus, the state variable WN(H) is an input to NOR gates NR1 30 through NR(N-1) 32.

From the above description it is possible to recognize the general pattern of circuit connections for an N input arbiter implemented in accordance with the design of the present invention.

The asynchronous access request R(n)(L) from the $n^{th}$ device, for requesting access to the shared resource, is input into the first stage flip-flop FS1(n).

The output of the flip-flop FS1(n) is coupled to an input of an N input NOR gate NR(n). Thus, RS(n)(L), the synchronized access request signal output from FS1(n) is an input to the NOR gate NR(n). Another (n-1) inputs to the NOR gate NR(n) are coupled to the outputs of the previous NOR gates NR1 through NR(n-1) when (n>1). In this way, the output signals RW1(H) through RW(n-1) from the previous NOR gates, become inputs to NR(n) when (n>1). The remaining (N-n) inputs to NR(n) are coupled to the outputs of the second stage flip-flops FS2(n+1) through FS2(N) when (n<N). The state variables W(n+1)(H) through W(N)(H), output from FS2(n+1) through FS2(N), therefore serve as inputs to NR(n) when (n<N).

The output of the NOR gate NR(n) is coupled to the input of the flip-flop FS2(n) and an input to each of the NOR gates NR(n+1) through NR(N) when (n<N). The signal RW(n)(H), output by NR(n) is therefore an input to FS2(n) and the NOR gates NR(n+1) through NR(N) when (n<N).

The second stage flip-flop FS2(n) has its output coupled to inputs of the previous NOR gates NR1 through NR(n-1) when (n>1). Thus, the state variable W(n)(H), which is the output of FS2(n) is an input signal to NOR gates NR1 through NR(n-1) when (n>1).

What is claimed is:

1. A logic circuit for generating a set of output signals in response to and as a function of a set of input signals, the circuit comprising:

a set of N logic gates, each having N inputs, with one of the N inputs being used for application of one of the set of input signals, and an output;

a set of N state elements, each one of the state elements having an input coupled to the output of a corresponding one of the N logic gates, and an output to provide one of the set of output signals;

for each nth logic gate of the N logic gates, each of (N-n) remaining inputs, when n<N, is coupled to the output of a corresponding one of the n+1th to Nth state elements of the N state elements and each of n-1 remaining inputs, when n>1, is coupled to the output of a corresponding one of the 1st to (n-1)th logic gates;

such that the set of output signals is a function of the set of input signals and the output of the set of N logic gates.

2. The logic circuit of claim 1 wherein each one of the set of N logic gates is a NOR gate and each one of the set of N state elements is a flip-flop device.

3. The logic circuit of claim 2 wherein each of the set of input signals represent a request for access to a shared resource and each of the set of output signals represent whether a corresponding request has been granted.

4. The logic circuit of claim 1 wherein the set of input signals comprises a set of asynchronous input signals; and further comprising a set of N synchronization state elements for synchronizing the asynchronous input signals, each of the synchronization state elements having an input and an output;

each one of the set of asynchronous input signals being applied to one of the inputs of the N synchronization state elements and the output of each one of the N synchronization state elements being coupled to one input of a corresponding one of the N logic gates.

5. An arbiter, which comprises:

a set of N NOR gates, each having N inputs with one of the N inputs being used for input of a request for arbitration signal, and an output;

a set of flip-flop devices, each having an input coupled to the output of a corresponding one of the N NOR gates, and an output for output of arbitration request grant information;

for each nth NOR gate of the N NOR gates, each of (N-n) remaining inputs, when n<N, is coupled to the output of a corresponding one of the (n+1)th to Nth flip-flop devices and each of n−1 remaining inputs, when n>1, is coupled to the output of a corresponding one of the 1st to (n−1)th NOR gates so that only one output of the flip-flop devices is asserted at any one time for any set of request for arbitration signals input to the set of N NOR gates.

6. The arbiter of claim 5 wherein each one of the N flip-flop devices comprise a D type flip-flop device.

7. The arbiter of claim 5 wherein N=3.

8. The arbiter of claim 5 wherein the request for arbitration signals are asynchronous signals, and further comprising a set of N synchronization flip-flop devices for synchronizing the asynchronous request for arbitration signals, each of the synchronization flip flops having an input and an output; each one of the request for arbitration signals being coupled to a corresponding one of the inputs of the N synchronization flip-flops and the output of each one of the N synchronization flip-flops being coupled to one input of a corresponding one of the NOR gates.

* * * * *